United States Patent
Nanao et al.

(10) Patent No.: US 11,740,546 B2
(45) Date of Patent: Aug. 29, 2023

(54) MULTI CHARGED PARTICLE BEAM WRITING APPARATUS AND METHOD OF ADJUSTING SAME

(71) Applicant: NuFlare Technology, Inc., Yokohama (JP)

(72) Inventors: Tsubasa Nanao, Yokohama (JP); Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/653,665

(22) Filed: Mar. 7, 2022

(65) Prior Publication Data

US 2022/0299861 A1    Sep. 22, 2022

(30) Foreign Application Priority Data

Mar. 22, 2021  (JP) ................. 2021-047496

(51) Int. Cl.
  *H01J 37/302* (2006.01)
  *H01J 37/317* (2006.01)
  (Continued)

(52) U.S. Cl.
  CPC ............ *G03F 1/20* (2013.01); *G03F 7/70641* (2013.01); *H01J 37/10* (2013.01); *H01J 37/302* (2013.01);
  (Continued)

(58) Field of Classification Search
  CPC ........ G03F 1/20; G03F 7/70641; H01J 37/10; H01J 37/302; H01J 37/3177; H01J 2237/1532; H01J 2237/21
  See application file for complete search history.

(56) References Cited

U.S. PATENT DOCUMENTS 5,929,454 A  7/1999  Muraki et al.
6,831,260 B2 * 12/2004  Goto ................... H01J 37/3174
                                                   250/492.23
(Continued)

FOREIGN PATENT DOCUMENTS

JP        9-330680 A    12/1997
JP        11-145042 A    5/1999
(Continued)

*Primary Examiner* — Sean M Luck
(74) *Attorney, Agent, or Firm* — Oblon, McClelland, Maier & Neustadt, L.L.P.

(57) ABSTRACT

In one embodiment, a multi charged particle beam writing apparatus includes an objective lens adjusting focus positions of multiple beams, an astigmatism correction element correcting astigmatism of the multiple beams, an inspection aperture allowing one of the multiple beams to pass therethrough, a deflector deflecting the multiple beams and causing the multiple beams to scan over the inspection aperture, a current detector detecting beam currents of the individual multiple beams after passing through the inspection aperture, a beam image formation unit forming a beam image based on the detected beam currents, a feature amount calculation unit generating a first waveform and a second waveform by adding brightnesses of the beam image in a first direction and in a second direction, and calculating a first and a second feature amounts from the first and the second waveforms, and a parameter calculation unit calculating an exciting parameter that is to be set for the astigmatism correction element based on the first feature amount and the second feature amount.

17 Claims, 7 Drawing Sheets

(51) Int. Cl.
*H01J 37/10* (2006.01)
*G03F 1/20* (2012.01)
*G03F 7/00* (2006.01)

(52) U.S. Cl.
CPC ... *H01J 37/3177* (2013.01); *H01J 2237/1532* (2013.01); *H01J 2237/21* (2013.01)

(56) References Cited

U.S. PATENT DOCUMENTS

| | | | |
|---|---|---|---|
| 7,034,314 B2 * | 4/2006 | Goto | B82Y 40/00 |
| | | | 250/492.1 |
| 9,190,245 B2 * | 11/2015 | Motosugi | H01J 37/21 |
| 2016/0086764 A1 | 3/2016 | Iizuka et al. | |
| 2018/0144905 A1 | 5/2018 | Iizuka et al. | |
| 2018/0247788 A1 * | 8/2018 | Fujisaki | H01J 37/045 |
| 2022/0299861 A1 * | 9/2022 | Nanao | H01J 37/10 |

FOREIGN PATENT DOCUMENTS

| | | |
|---|---|---|
| JP | 2016-63149 A | 4/2016 |
| JP | 2018-82120 A | 5/2018 |

* cited by examiner

ADD BRIGHTNESSES →

FIG.4C

↓ ADD BRIGHTNESSES

FIG.9A
NOT-WEIGHTED

FIG.9B
WEIGHTED

FIG.10

MULTI CHARGED PARTICLE BEAM WRITING APPARATUS AND METHOD OF ADJUSTING SAME

CROSS REFERENCE TO RELATED APPLICATION

This application is based upon and claims benefit of priority from the Japanese Patent Application No. 2021-47496, filed on Mar. 22, 2021, the entire contents of which are incorporated herein by reference.

FIELD

The present invention relates to a multi charged particle beam writing apparatus and a method of adjusting a multi charged particle beam writing apparatus.

BACKGROUND

With wafer-scale integration of LSIs, the circuit line widths of semiconductor devices have become finer and finer. As a method of forming exposure masks (also referred to as reticles when used in steppers or scanners) for forming circuit patterns onto these semiconductor devices, an electron beam writing technology having an excellent resolution is used.

As an electron beam writing apparatus, a writing apparatus using multiple beams has been developed instead of a related-art single beam writing apparatus in which a single beam is deflected and the deflected beam is applied for irradiation to a necessary location on a substrate. With use of multiple beams, irradiation can be made by using a larger number of beams than the case of using one electron beam to perform writing, and hence a throughput can be greatly increased. In a multi beam writing apparatus, for example, an electron beam emitted from an electron gun is passed through an aperture member with holes to form multiple beams, blanking control is performed for each of the beams with a blanking aperture array plate, and the beams that have not been shielded are reduced in diameters by an optical system and are applied to a substrate placed on a movable stage.

In the multi beam writing, adjustments of the optical system, such as focusing and astigmatism adjustment, are important. Until now, focusing has been made by scanning a line-shaped reflection mark on a stage with electron beams and detecting reflected electrons while changing a focus position of an objective lens, and by performing adjustment based on a profile detected for each focus position. Japanese Unexamined Patent Application Publication No. 2018-82120 discloses a technique of scanning an inspection aperture with multiple beams to form a beam image, obtaining an optimum focus position based on a feature amount of the beam image, and controlling an objective lens.

Japanese Unexamined Patent Application Publication No. 2018-82120 further discloses a technique of detecting a contour of each beam in the beam image, executing ellipse fitting, and controlling an excitation current value for an astigmatism correction coil such that the beam contour as close as to a true circle is obtained. However, the above-mentioned technique has a problem that, for example, when a blur is large or when an amount of astigmatism is large, the fitting may be failed, and an analysis may be difficult to execute.

DETAILED DESCRIPTION

In one embodiment, a multi charged particle beam writing apparatus includes an objective lens adjusting focus positions of multiple beams, an astigmatism correction element correcting astigmatism of the multiple beams, a stage on which a substrate serving as a writing target is placed, an inspection aperture disposed on the stage and allowing one of the multiple beams to pass therethrough, a current detector detecting beam currents of the individual multiple beams after passing through the inspection aperture, a deflector deflecting the multiple beams and causing the multiple beams to scan over the inspection aperture, a beam image formation unit forming a beam image based on the detected beam currents, a feature amount calculation unit generating a first waveform by adding brightnesses of the beam image in a first direction, calculating a first feature amount from the first waveform, generating a second waveform by adding the brightnesses of the beam image in a second direction different from the first direction, and calculating a second feature amount from the second waveform, and a parameter calculation unit calculating an exciting parameter that is to be set for the astigmatism correction element based on the first feature amount and the second feature amount.

An embodiment of the present invention will be described below with reference to the drawings.

Figure 1:
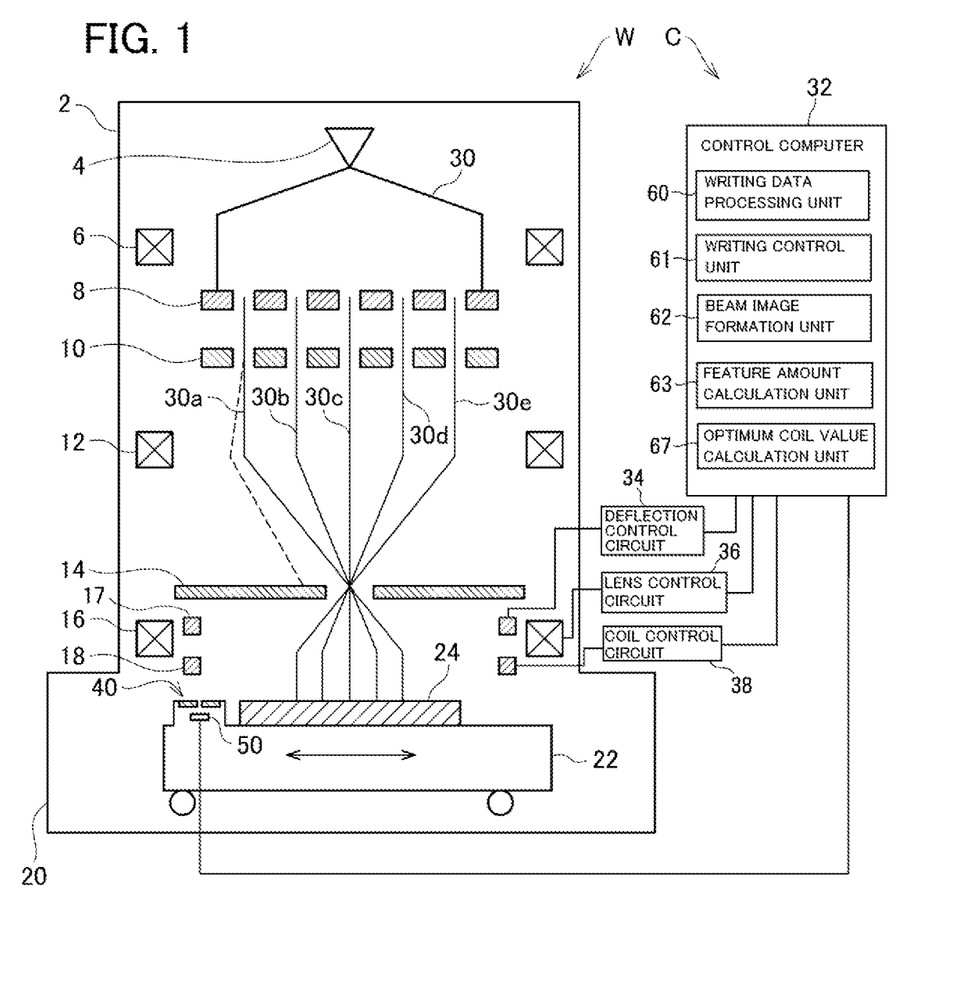
FIG. 1 is a schematic view of a multi charged particle beam writing apparatus according to an embodiment of the present invention.

FIG. 1 is a schematic diagram of a multi charged particle beam writing apparatus according to an embodiment of the present invention. In the embodiment, a configuration using an electron beam as an example of a charged particle beam will be described. The charged particle beam is not limited to the electron beam. For example, the charged particle beam may be an ion beam.

The writing apparatus includes a writing unit W that irradiates a substrate 24 serving as a writing target with electron beams to write a desired pattern, and a control unit C that controls operation of the writing unit W.

The writing unit W includes an electron beam barrel 2 and a writing chamber 20. An electron gun 4, an illumination lens 6, an aperture member 8, a blanking aperture array plate 10, a reducing lens 12, a restriction aperture member 14, an objective lens 16, a deflector 17, and an astigmatism correction coil 18 are disposed in the electron beam barrel 2.

An XY stage 22 is disposed in the writing chamber 20. The substrate 24 serving as the writing target is placed on the XY stage 22. The substrate 24 serving as the writing target includes, for example, a wafer and an exposure mask to transfer a pattern to the wafer by using a step-and-repeat exposure apparatus or an extreme ultraviolet (EUV) exposure apparatus, such as a stepper or a scanner, with an excimer laser being a light source.

A beam inspection device for multiple beams, including a multi beam inspection aperture 40 (hereinafter called an "inspection aperture 40") and a current detector 50, is further disposed on the XY stage 22 at a different position from a position at which the substrate 24 is placed. The height of the inspection aperture 40 is adjustable by an adjustment mechanism (not illustrated). The inspection aperture 40 is preferably set at the same height as the substrate 24.

The control unit C includes a control computer 32, a deflection control circuit 34, a lens control circuit 36, and a coil control circuit 38. The deflection control circuit 34 is connected to the deflector 17. The lens control circuit 36 is connected to the objective lens 16. The coil control circuit 38 is connected to the astigmatism correction coil 18.

The control computer 32 includes a writing data processing unit 60, a writing control unit 61, a beam image formation unit 62, a feature amount calculation unit 63, and an optimum coil value calculation unit 67 (parameter calculation unit). Those components of the control computer 32 may be constituted by hardware such as electrical circuits or by software such as programs that execute the functions of the components. When software is used, the programs executing those functions may be stored in a recording medium and executed by causing a computer, including electrical circuits, to read the programs.

Writing data obtained by converting design data (layout data) to formats for the writing apparatus is stored in a memory (not illustrated). The writing data processing unit 60 reads out the writing data from the memory and executes a data conversion process in a plurality of stages, thus generating shot data. The shot data is generated per pixel, and a writing time (irradiation time) is calculated. For example, when any pattern is not formed on a target pixel, there is no beam irradiation, and hence an identification code indicating the writing time being zero or no beam irradiation is defined. Here, a maximum writing time T (maximum exposure time) for one multi beam shot is set in advance. The irradiation time of each beam to be actually applied is preferably determined in proportion to a calculated area density of the pattern. Furthermore, the finally calculated irradiation time of each beam is preferably set to a time corresponding to an irradiation dose after correcting amounts of dimensional variations due to phenomena causing the dimensional variations, such as a proximity effect, a fog effect, and a loading effect (which are not illustrated here), in terms of irradiation dose. Thus, the irradiation time of each actually applied beam may be different per beam. The writing time (irradiation time) of each beam is calculated as a value within the maximum writing time T. In addition, the writing data processing unit 60 generates an irradiation time sequence data that is obtained by arraying the calculated irradiation time data of individual pixels, as data for beams to be used for writing those pixels, in beam sequence order of the multiple beams per multi beam shot.

The deflection control circuit 34 generates, from the irradiation time sequence data (shot data), deflection amount data in accordance with which the multiple beams are to be deflected. The writing control unit 61 outputs control signals for executing a writing process to the deflection control circuit 34 and a control circuit (not illustrated) that drives the writing unit W. In accordance with the control signal, the writing unit W writes the desired pattern on the substrate 24 by using the multiple beams. In more detail, the writing apparatus operates as follows.

Figure 2:
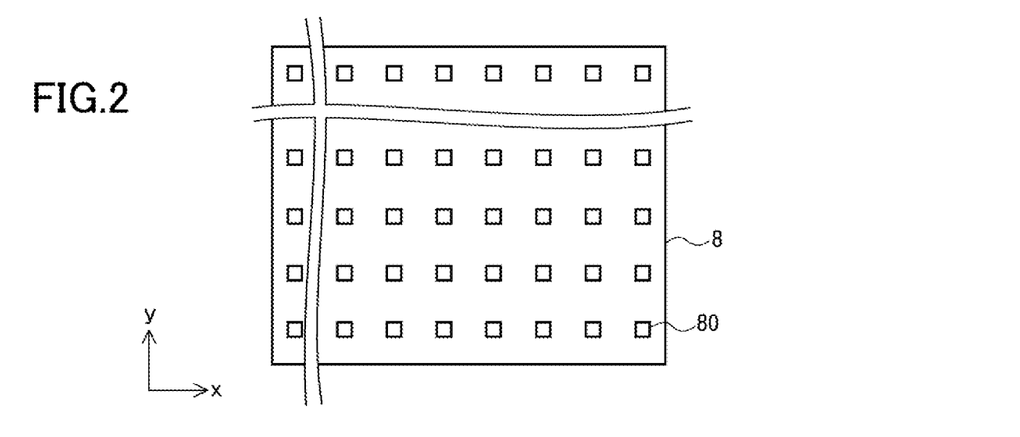
FIG. 2 is a schematic view of an aperture member.

An electron beam 30 emitted from the electron gun 4 almost perpendicularly illuminates the entirety of the aperture member 8 through the illumination lens 6. FIG. 2 is a conceptual view illustrating a configuration of the aperture member 8. Openings 80 of m columns in a vertical direction (y-direction) and n rows in a horizontal direction (x-direction) (m and n≥2) are formed in the aperture member 8 in a matrix pattern at a predetermined array pitch. For example, the openings 80 of 512 columns×512 rows are formed. The openings 80 are all formed in rectangular shapes with the same dimensions. The openings 80 may have circular shapes with the same diameter.

The electron beam 30 illuminates a region where all the openings 80 of the aperture member 8 are included. Part of the electron beam 30 passes through each of the openings 80 in one-to-one relation, whereby multiple beams 30a to 30e illustrated in FIG. 1 are formed.

Through-holes are formed in the blanking aperture array plate 10 in match with positions at which the openings 80 are arranged in the aperture member 8, and a blanker constituted by a pair of two electrodes is disposed for each of the through-holes. The electron beams 30a to 30e passing through the through-holes are deflected independently of one another due to voltages applied from the blankers. With that deflection, blanking control is performed on each beam. Thus, the blanking aperture array plate 10 performs the blanking deflection on the individual multiple beams after passing through the openings 80 in the aperture member 8.

The multiple beams 30a to 30e after passing through the blanking aperture array plate 10 are reduced in beam size and array pitch for each beam by the reducing lens 12 and advance toward an opening that is formed at a center of the restriction aperture member 14. An orbit of the electron beam deflected by the blanker in the blanking aperture array plate 10 is displaced such that the deflected electron beam hits on a position away from the opening at the center of the restriction aperture member 14 and is shielded by the restriction aperture member 14. On the other hand, the electron beam not deflected by the blanker in the blanking aperture array plate 10 passes through the opening at the center of the restriction aperture member 14.

The restriction aperture member 14 shields each electron beam that has been deflected into a beam-off state by the blanker in the blanking aperture array plate 10. The beams after passing through the restriction aperture member 14 during a time from beam-on to beam-off become the electron beams per shot.

The electron beams 30a to 30e after passing through the restriction aperture member 14 are focused by the objective lens 16 to form a pattern image at a desired reduction rate on the substrate 24. All the electron beams (entirety of the multiple beams) after passing through the restriction aperture member 14 are deflected together to advance in the same direction by the deflector 17 and are applied to the substrate 24.

Ideally, the multiple beams applied at a time are arrayed at a pitch resulting from multiplying the array pitch of the openings 80 in the aperture member 8 by the above-mentioned desired reduction rate. In the writing apparatus according to this embodiment, a writing operation is performed in a raster scan mode of continuously applying shot beams in order and, in writing the desired pattern, beams required corresponding to the pattern are controlled to a beam-on state by the blanking control. When the XY stage 22 is continuously moved, beam irradiation positions are controlled by the deflector 17 to follow the movement of the XY stage 22.

In the above-described writing apparatus, an optical system needs to be adjusted to correct astigmatism for improving writing accuracy. In this embodiment, the optical system is adjusted by inspecting the beams with the beam inspection device for multiple beams, the device including the inspection aperture 40 and the current detector 50.

The inspection aperture 40 allows only one electron beam to pass therethrough. For example, one through-hole is formed at a center of the inspection aperture 40. When a beam pitch of the multiple beams on the substrate 24 is denoted by P and a size of (one) beam is denoted by S, a diameter $\phi 1$ of the through-hole preferably satisfies $S<\phi 1<P-S$. Because of $S<P-S$, the beam pitch P is larger than twice the beam size S.

With the diameter $\phi 1$ set to be larger than the beam size S, the entirety of one electron beam can pass through the through-hole, and an S/N ratio can be increased. The diameter $\phi 1$ is preferably as large as possible from the viewpoint of making it easier to find the beam and avoiding the through-hole from being clopped with foreign matters.

Furthermore, with the diameter $\phi 1$ set to be smaller than P–S, when the multiple beams are scanned, (parts of) two adjacent beams are prevented from passing through the through-hole at the same time. Thus, the through-hole allows only one electron beam of the multiple beams to pass through the through-hole.

The one electron beam after passing through the through-hole in the inspection aperture 40 enters the current detector 50, and a beam current is detected. For example, an SSD (solid-state detector) can be used as the current detector 50. A result detected by the current detector 50 is notified to the control computer 32.

Figure 3:
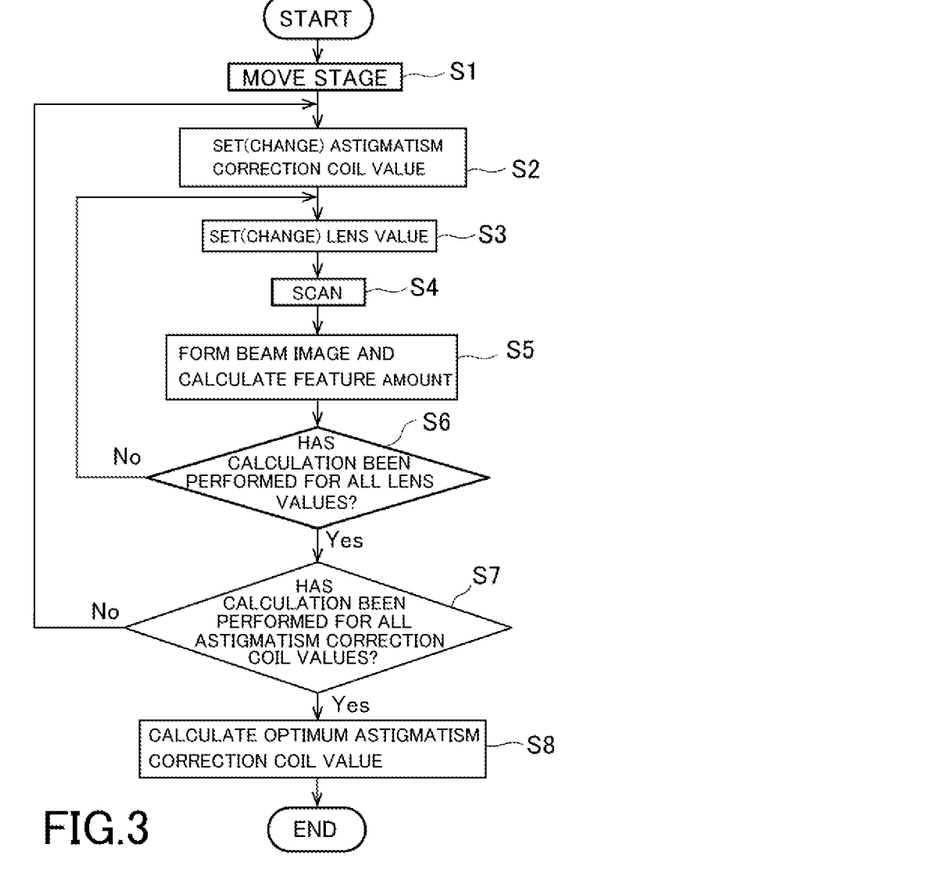
FIG. 3 is a flowchart representing an astigmatism adjustment method according to the embodiment.

A method of adjusting astigmatism will be described below with reference to a flowchart illustrated in FIG. 3.

The XY stage 22 is moved to arrange the inspection aperture 40 at a position where the inspection aperture 40 can be irradiated with the multiple beams (step S1).

The coil control circuit 38 changes and sets exciting parameters (an exciting current value and an astigmatism correction coil value) for the astigmatism correction coil 18 (astigmatism correction element) that corrects the astigmatism (step S2). As described later, the astigmatism correction coil value is variably set to one of plural values within a preset range. First, the astigmatism correction coil value is set to E1.

The lens control circuit 36 changes and sets exciting parameters (an exciting current value and a lens value) for the objective lens 16 (step S3). As described later, the lens value is variably set to one of plural values within a preset range.

The multiple beams are deflected in XY-directions by the deflector 17 to scan the inspection aperture 40 in a manner of successively changing the electron beam that passes through the through-hole (step S4). The current detector 50 detects beam currents. Scan directions are not limited to the XY-directions (beam array directions) and may be any suitable directions. The multiple beams for use in the above scan do not need to be all of the beams that are formed by passing through the openings 80 in the aperture member 8 and may be part of the beams. In other words, the inspection aperture 40 may be scanned by setting some of the blankers in the blanking aperture array plate 10 to the beam-on state and the other blankers to the beam-off state.

The control computer 32 obtains the beam currents detected by the current detector 50. The beam image formation unit 62 converts each of the beam currents to brightness and forms a beam image based on deflection amounts given by the deflector 17. Then, the feature amount calculation unit 63 calculates a feature amount from the beam image (step S5).

Figure 4A:
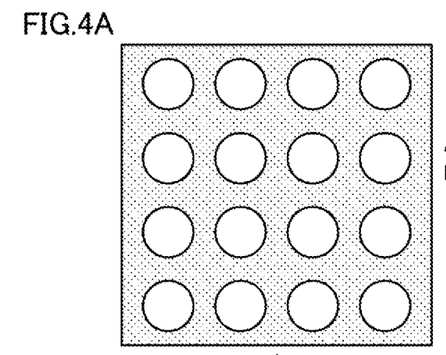
FIG. 4A illustrates a beam image, and FIGS. 4B and 4C each illustrate a brightness added waveform.
Figure 4B:
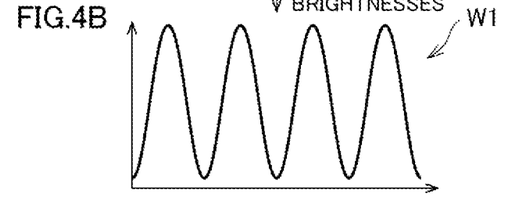

For example, the feature amount calculation unit 63 adds brightnesses of the beam image illustrated in FIG. 4A in the vertical direction (y-directions) and calculates a waveform W1 illustrated in FIG. 4B. The feature amount calculation unit 63 further adds the brightnesses of the beam image in the horizontal direction (x-directions) and calculates a waveform W2 illustrated in FIG. 4C.

Figure 4C:
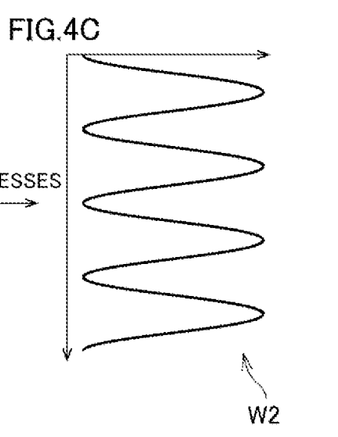

Then, the feature amount calculation unit 63 calculates a feature amount A1 of the waveform W1 and a feature amount A2 of the waveform W2. For example, variances of the brightnesses (brightness added values) are calculated as the feature amounts A1 and A2. As beam shapes in the beam image are as close to true circles, a variation in the brightnesses of the beam image increases, and a variance value of the brightnesses in terms of the feature amount increases.

The above-described scan over the inspection aperture 40, formation of the beam image, and calculation of the feature amounts are performed for all the lens values within the preset range (steps S3 to S6).

Next, after returning to step S2, the astigmatism correction coil value is changed and set to E2. Then, the above-described scan over the inspection aperture 40, formation of the beam image, and calculation of the feature amounts are performed for all the lens values within the preset range (steps S3 to S6).

Figure 5A:
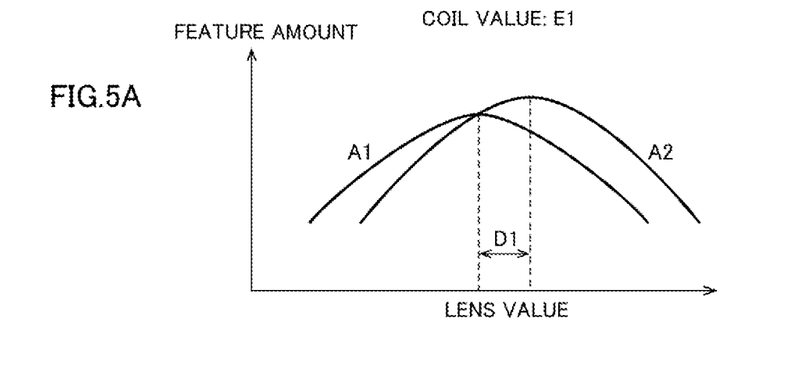
FIGS. 5A and 5B are each a graph representing an example of relation between a lens value and a feature amount.
Figure 5B:
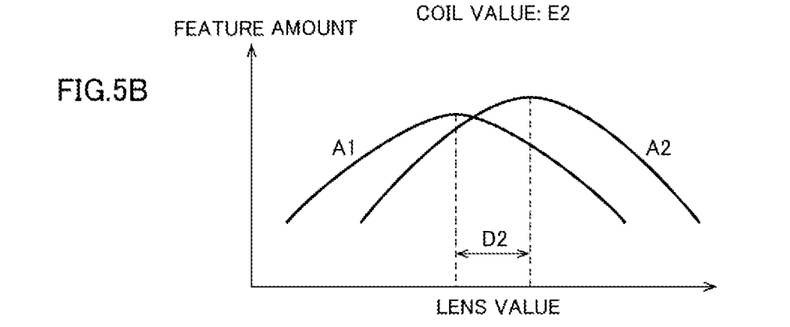

FIG. 5A is a graph representing changes in the feature amounts A1 and A2 when the astigmatism correction coil value is set to E1, the vertical axis indicates the feature amount, and the horizontal axis indicates the lens value. FIG. 5B is a graph representing changes in the feature amounts A1 and A2 when the astigmatism correction coil value is set to E2, the vertical axis indicates the feature amount, and the horizontal axis indicates the lens value.

After setting the astigmatism correction coil value to each of E1 and E2 and calculating the feature amounts A1 and A2 for all the lens values within the preset range (Yes in step S7), the optimum coil value calculation unit 67 calculates an optimum astigmatism correction coil value as follows (step S8).

In the graphs illustrated in FIGS. 5A and 5B, the lens value at which the feature amount A1 takes an extreme value and the lens value at which the feature amount A2 takes an extreme value do not match and are apart from each other. In FIG. 5A, a difference between the lens value at which the feature amount A1 takes an extreme value and the lens value at which the feature amount A2 takes an extreme value is D1. In FIG. 5B, a difference between the lens value at which the feature amount A1 takes an extreme value and the lens value at which the feature amount A2 takes an extreme value is D2. The difference between the lens values at which the feature amounts take the extreme values depends on distortions of the beam shapes attributable to the astigmatism.

Figure 6:
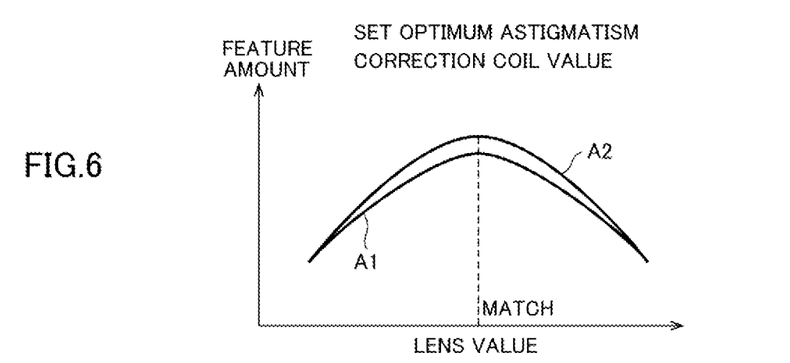
FIG. 6 is a graph representing an example of relation between the lens value and the feature amount.

As the astigmatism correction coil value is as close as to an optimum value, roundness of the beam shapes increases, and the difference between the lens values providing the extreme values of the feature amounts reduces. From the difference D1 when the astigmatism correction coil value is set to E1 and the difference D2 when the astigmatism correction coil value is set to E2, the optimum coil value calculation unit 67 calculates a coil value (optimum astigmatism correction coil value) at which the lens values providing the extreme values of the feature amounts match with each other and both the differences become 0 as illustrated in FIG. 6.

The writing control unit 61 sets the calculated optimum astigmatism correction coil value for the astigmatism correction coil 18. As a result, the astigmatism of the multiple beams can be corrected with high accuracy, and the pattern can be written with high accuracy.

Thus, according to this embodiment, the beam image can be formed in a short time by scanning the inspection aperture 40 with the multiple beams and by successively changing the electron beam that passes through the through-hole. The astigmatism correction coil value of the astigmatism correction coil 18 and the lens value of the objective lens 16 are variously set to form a plurality of the beam images at the different astigmatism correction coil values and the different focus positions. Brightnesses of each beam image are added in the x-direction and the y-direction to form the waveforms W1 and W2, and the feature amounts A1 and A2 of the waveforms W1 and W2 are calculated. The optimum astigmatism correction coil value at which the lens value providing the extreme value of the feature amount A1 and the lens value providing the extreme value of the feature amount A2 match with each other is calculated. Therefore, the optimum astigmatism correction coil value can be determined in a short time with high accuracy.

Although, in the above-described embodiment, the difference D1 when the astigmatism correction coil value is set to E1 and the difference D2 when the astigmatism correction coil value is set to E2 are calculated, three or more coil values may be set for the astigmatism correction coil 18.

Figure 7:
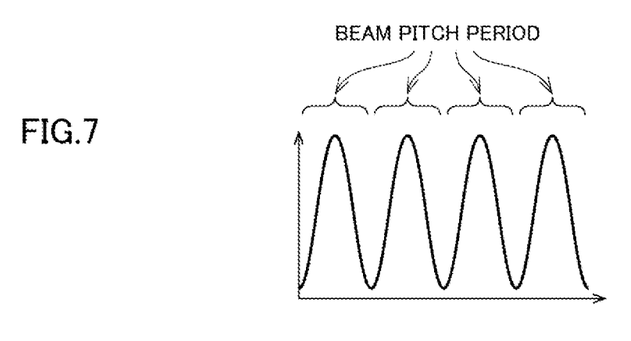
FIG. 7 illustrates a brightness added waveform.

Although, in the above-described embodiment, the variance is used as the feature amount of the waveform (brightness added value), a difference between a maximum value and a minimum value of the waveform may be used as the feature amount. Alternatively, a difference between a maximum value and a minimum value of differential values of the waveform may be used as the feature amount. In another example, as illustrated in FIG. 7, the difference between a maximum value and a minimum value may be calculated per beam pitch period, and a total of the calculated differences may be used as the feature amount.

Figure 8:
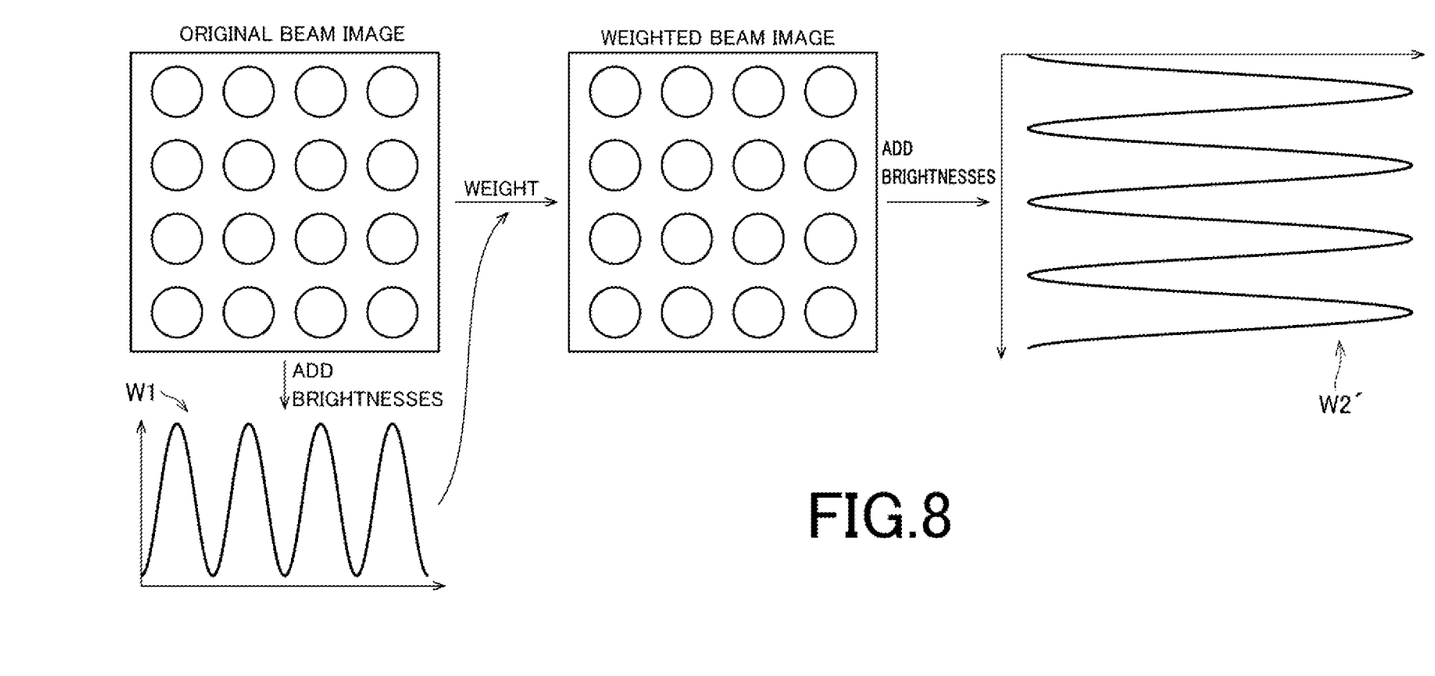
FIG. 8 illustrates a brightness added waveform after weighting.
Figure 9A:
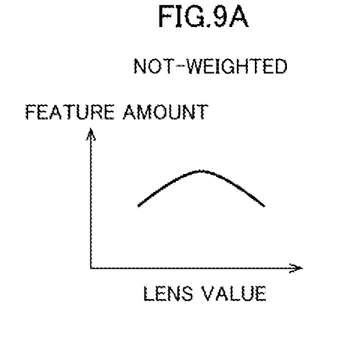
FIGS. 9A and 9B are each a graph representing an example of relation between the lens value and the feature amount.
Figure 9B:
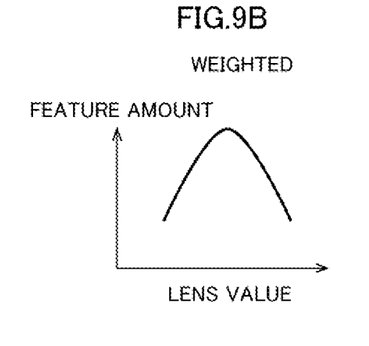

As illustrated in FIG. 8, the feature amount calculation unit 63 may weight the brightnesses of the beam image by using the waveform W1 obtained by adding the brightnesses in the y-direction and may calculate a waveform W2' by adding the weighted brightnesses in the x-direction. For example, the feature amount calculated per lens value from the not-weighted waveform W2 varies as illustrated in FIG. 9A, while the feature amount calculated per lens value from the weighted waveform W2' varies as illustrated in FIG. 9B. Thus, the lens value providing the extreme value of the feature amount is emphasized in FIG. 9B.

Likewise, the brightnesses of the beam image may be weighted by using the waveform W2 obtained by adding the brightnesses in the x-direction, a waveform W1' may be calculated by adding the weighted brightnesses in the y-direction, and the feature amount may be calculated from the waveform W1'.

Figure 10:
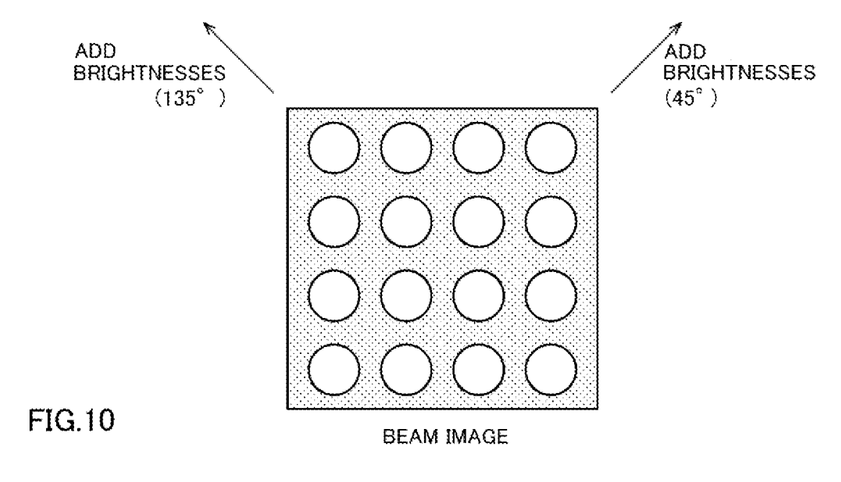
FIG. 10 illustrates a brightness addition direction.

Although, in the above-described embodiment, the waveforms is obtained by adding the brightnesses of the beam image in each of the beam array directions along the x-direction)(0°) and the y-direction) (90°), the addition directions are not limited to those ones and may be set to any two suitable directions in which the astigmatism correction is to be adjusted. For example, as illustrated in FIG. 10, the waveform may be obtained by adding the brightnesses of the beam image in each of oblique orthogonal directions (45° and 135°). Because the astigmatism generates as an optical phenomenon in a 90° direction, results of obtaining waveforms by adding the brightnesses in two orthogonal directions and of calculating the feature amounts from the obtained waveforms can be regarded as independent components of the astigmatism, and the astigmatism can be corrected with high efficiency.

Although the above-described embodiment has been described in connection with the configuration of correcting the astigmatism by using a magnetic field generated by the astigmatism correction coil, an astigmatism correcting lens or another astigmatism correction element using an electric field may also be used instead.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing apparatus comprising:

an objective lens adjusting focus positions of multiple beams;

an astigmatism correction element correcting astigmatism of the multiple beams;

a stage on which a substrate serving as a writing target is placed;

an inspection aperture disposed on the stage and allowing one of the multiple beams to pass therethrough;

a current detector detecting beam currents of the individual multiple beams after passing through the inspection aperture;

a deflector deflecting the multiple beams and causing the multiple beams to scan over the inspection aperture;

a beam image formation unit forming a beam image based on the detected beam currents;

a feature amount calculation unit generating a first waveform by adding brightnesses of the beam image in a first direction, calculating a first feature amount from the first waveform, generating a second waveform by adding the brightnesses of the beam image in a second direction different from the first direction, and calculating a second feature amount from the second waveform; and a parameter calculation unit calculating an exciting parameter that is to be set for the astigmatism correction element based on the first feature amount and the second feature amount.

2. The apparatus according to claim 1, wherein the inspection aperture is scanned for each of plural values of a first exciting parameter for the objective lens and for each of plural values of a second exciting parameter for the astigmatism correction element, the beam image formation unit forms a plurality of the beam images corresponding to the plural values of the first exciting parameter and the plural values of the second exciting parameter, the feature amount calculation unit calculates plural first feature amounts and plural second feature amounts from the plurality of the beam images, and the parameter calculation unit calculates a second exciting parameter to be set for the astigmatism correction element such that the value of the first exciting parameter at which the first feature amount takes an extreme value and the value of the first exciting parameter at which the second feature amount takes an extreme value match with each other based on the plural first feature amounts and the plural second feature amounts.

3. The apparatus according to claim 1, wherein the feature amount calculation unit weights the brightnesses of the beam image by using the first waveform and generates the second waveform by adding the weighted brightnesses of the beam image in the second direction.

4. The apparatus according to claim 1, wherein the first direction and the second direction are orthogonal to each other.

5. The apparatus according to claim 1, wherein the first direction and the second direction are beam array directions of the multiple beams.

6. The apparatus according to claim 1, wherein the first feature amount and the second feature amount are variances of the brightness in the first waveform and the second waveform.

7. The apparatus according to claim 1, wherein the first feature amount and the second feature amount are differences between maximum values and minimum values of the brightnesses in the first waveform and the second waveform.

8. The apparatus according to claim 1, wherein the first feature amount and the second feature amount are differences between maximum values and minimum values of differential values of the first waveform and the second waveform.

9. The apparatus according to claim 1, wherein the first feature amount and the second feature amount are total differences between maximum values and minimum values of the brightnesses per beam pitch period in the first waveform and the second waveform.

10. A method of adjusting a multi charged particle beam writing apparatus comprising:

executing a series of steps of setting an objective lens adjusting focus positions of multiple beams to a certain value of a first exciting parameter, scanning the multiple beams over an inspection aperture that is disposed on a stage and that allows one of the multiple beams to pass therethrough, detecting beam currents of the individual multiple beams after passing through the inspection aperture, forming a beam image at the certain value of the first exciting parameter based on the detected beam currents, generating a first waveform by adding brightnesses of the beam image in a first direction, calculating a first feature amount from the first waveform, generating a second waveform by adding the brightnesses of the beam image in a second direction different from the first direction, and calculating a second feature amount from the second waveform, the series of steps being repeated for each of plural values of the first exciting parameter while setting of the first exciting parameter is changed;

calculating the value of the first exciting parameter at which the first feature amount takes an extreme value, based on correlation between the first exciting parameter and the first feature amount, the correlation being obtained from plural values of the first feature amount corresponding to plural values of the first exciting parameter, calculating the value of the first exciting parameter at which the second feature amount takes an extreme value, based on correlation between the first exciting parameter and the second feature amount, the correlation being obtained from plural values of the second feature amount corresponding to plural values of the first exciting parameter, and calculating a second exciting parameter to be set for an astigmatism correction element, the astigmatism correction element correcting astigmatism of the multiple beams such that the value of the first exciting parameter at which the first feature amount takes an extreme value and the value of the first exciting parameter at which the second feature amount takes an extreme value match with each other.

11. The method according to claim 10, further comprising the step of weighting the brightnesses of the beam image by using the first waveform and generating the second waveform by adding the weighted brightnesses of the beam image in the second direction.

12. The method according to claim 10, wherein the first direction and the second direction are orthogonal to each other.

13. The method according to claim 12, wherein the first direction and the second direction are beam array directions of the multiple beams.

14. The method according to claim 10, wherein the first feature amount and the second feature amount are variances of the brightness in the first waveform and the second waveform.

15. The method according to claim 10, wherein the first feature amount and the second feature amount are differences between maximum values and minimum values of the brightnesses in the first waveform and the second waveform.

16. The method according to claim 10, wherein the first feature amount and the second feature amount are differences between maximum values and minimum values of differential values of the first waveform and the second waveform.

17. The method according to claim 10, wherein the first feature amount and the second feature amount are total differences between maximum values and minimum values of the brightnesses per beam pitch period in the first waveform and the second waveform.

* * * * *